(12) United States Patent
Choi et al.

(10) Patent No.: US 7,402,862 B2
(45) Date of Patent: Jul. 22, 2008

(54) MULTI-BIT NON-VOLATILE MEMORY DEVICE HAVING A DUAL-GATE AND METHOD OF MANUFACTURING THE SAME, AND METHOD OF MULTI-BIT CELL OPERATION

(75) Inventors: Yang-Kyu Choi, Daejeon (KR); Hyunjin Lee, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 61 days.

(21) Appl. No.: 11/379,723

(22) Filed: Apr. 21, 2006

(65) Prior Publication Data
US 2006/0237777 A1    Oct. 26, 2006

(30) Foreign Application Priority Data
Apr. 22, 2005    (KR) ...................... 10-2005-0033697

(51) Int. Cl.
*H01L 29/792*    (2006.01)

(52) U.S. Cl. ............... 257/324; 257/314; 257/E29.279; 365/184; 327/579

(58) Field of Classification Search ................ 257/324
See application file for complete search history.

(56) References Cited

U.S. PATENT DOCUMENTS

| 6,011,725 | A * | 1/2000 | Eitan ...................... 365/185.33 |
| 6,903,967 | B2 * | 6/2005 | Mathew et al. .............. 365/177 |
| 2003/0062567 | A1 * | 4/2003 | Zheng et al. ................. 257/316 |

* cited by examiner

*Primary Examiner*—Evan Pert
*Assistant Examiner*—Eddie A Rodela
(74) *Attorney, Agent, or Firm*—Abelman, Frayne & Schwab; Harry K. Ahn

(57) ABSTRACT

The present invention relates to a multi-bit non-volatile memory device having a dual gate employing local charge trap and method of manufacturing the same, and an operating method for a multi-bit cell operation.

10 Claims, 11 Drawing Sheets

2-bit operation

—— Normal direction Read ($V_D > V_S$)
------ Reverse direction Read ($V_D > V_S$)

|  |  | P | E | R |
|---|---|---|---|---|
| Bit1 | $V_G$ | $V_{WP}$ | $V_{WE}$ | $V_{WR}$ |
|  | $V_D$ | $V_{BP}$ | $V_{BE}$ | 0 |
|  | $V_S$ | 0 | 0 | $V_{DD}$ |
| Bit2 | $V_G$ | $V_{WP}$ | $V_{WE}$ | $V_{WR}$ |
|  | $V_D$ | 0 | 0 | $V_{DD}$ |
|  | $V_S$ | $V_{BP}$ | $V_{BE}$ | 0 |

P:Program
E:Erase
R:Read $V_{WP} > V_{BP} > V_{DD}$
$V_{WE} < 0,\ V_{BE} > 0$
$V_{WP} > V_{WR}$ 3-bit operation ——— Normal direction Read ($V_D > V_S$)
------- Reverse direction Read ($V_D > V_S$)

| | | $V_{G1}$ | $V_{G2}$ | $V_D$ | $V_S$ |
|---|---|---|---|---|---|
| Bit (P) | 1 | $V_{WP1}$ | 0 | $V_{BP}$ | 0 |
| | 2 | $V_{WP1}$ | 0 | 0 | $V_{BP}$ |
| | 3 | 0 | $V_{WP2}$ | $V_{BP}$ | 0 |
| | 4 | 0 | $V_{WP2}$ | 0 | $V_{BP}$ |
| | | $V_{G1}$ | $V_{G2}$ | $V_D$ | $V_S$ |
| Read | | $V_{WR1}$ | $V_{WR2}$ | $V_{DD}$ | 0 |
| | | $V_{WR1}$ | $V_{WR2}$ | 0 | $V_{DD}$ |

4-bit operation

P:Program $V_{WP1}$, $V_{WP2}$ > $V_{BP}$ > $V_{DD}$
$V_{WP1}$ = $V_{-1}$ = $V_{DD}$
$V_{WR2}$ = $V_{-2}$ = $V_{DD}$ Using Normal & Reverse direction Read

| | | $V_{G1}$ | $V_{G2}$ | $V_D$ | $V_S$ |
|---|---|---|---|---|---|
| Bit (P) | 1 | $V_{WP1}$ | 0 | $V_{BP}$ | 0 |
| | 2 | $V_{WP1}$ | 0 | 0 | $V_{BP}$ |
| | 3 | 0 | $V_{WP2}$ | $V_{BP}$ | 0 |
| | 4 | 0 | $V_{WP2}$ | 0 | $V_{BP}$ |
| | | $V_{G1}$ | $V_{G2}$ | $V_D$ | $V_S$ |
| Read | | $V_{WR1}$ | $V_{WR2}$ | $V_{DD}$ | 0 |

Using Normal & Reverse direction Read 4-bit operation

P:Program $V_{WP1}, V_{WP2} > V_{BP} > V_{DD}$
$V_{WP1} = V_{T1} + V_{DD}$
$V_{WR2} = V_{T2} + V_{DD}$

| | | $V_{G1}$ | $V_{G2}$ | $V_D$ | $V_S$ |
|---|---|---|---|---|---|
| Bit (P) | 1 | $V_{WP1}$ | 0 | $V_{BP}$ | 0 |
| | 2 | $V_{WP1}$ | 0 | 0 | $V_{BP}$ |
| | 3 | 0 | $V_{WP2}$ | $V_{BP}$ | 0 |
| | 4 | 0 | $V_{WP2}$ | 0 | $V_{BP}$ |
| | | $V_{G1}$ | $V_{G2}$ | $V_D$ | $V_S$ |
| Read | | $V_{WR1}$ | $V_{WR2}$ | $V_{DD}$ | 0 |
| | | $V_{WR1}$ | $V_{WR2}$ | 0 | $V_{DD}$ |

5-bit operation

P:Program $V_{WP1}, V_{WP2} > V_{BP} > V_{DD}$
$V_{WP1} = V_{T1} - V_{DD}$
$V_{WR2} = V_{T2} - V_{DD}$ Using Normal & Reverse direction Read

MULTI-BIT NON-VOLATILE MEMORY DEVICE HAVING A DUAL-GATE AND METHOD OF MANUFACTURING THE SAME, AND METHOD OF MULTI-BIT CELL OPERATION

This Nonprovisional application claims priority under 35 U.S.C. §119(a) on Patent Application No. 10-2005-0033697 filed in Korea on Apr. 22, 2005, the entire contents of which are hereby incorporated by reference.

BACKGROUND

1. Field of the Invention

The present invention relates to non-volatile memory devices and method of manufacturing the same. More particularly, the present invention relates to a multi-bit non-volatile memory device having a dual gate structure, and method of manufacturing the same, and an operating method for a multi-bit cell operation.

2. Discussion of Related Art

A flash memory, i.e., a non-volatile memory device in which data can be electrically programmed/erased/read can be higher integrated and have a superior data integrity. Therefore, the flash memory can be used as an auxiliary memory of a system and can also be applied to DRAM interface.

The flash memory has been designed toward a direction in which the level of integration is increased and the size is miniaturized. However, in the case where a device structure of an existing 2 dimensional channel is employed, a short channel effect, such as an increase in the leakage current, is generated when the device size shrinks. Accordingly, a problem arises because the integration is limited. To reduce the short channel effect, 30 nm grade triple gate non-volatile memory cells employing a multi gate pin FET structure, a charge trapping type structure, such as MNOS (Metal Nitride Oxide Semiconductor) and MONOS (Metal Oxide Nitride Oxide Semiconductor), and a SONOS (Poly-Silicon Oxide Nitride Oxide Semiconductor) structure was fabricated. However, there is a problem in that the related art gate structures do not sufficiently reduce the short channel effect.

Furthermore, the related art triple gate non-volatile memory cells operate 1-bit. Accordingly, there is an urgent need for multi-bit techniques in which 2-bit or more data can be stored per cell in order to lower the cost per bit and increase the degree of integration. In other words, for the purpose of higher integration of the memory, there is a need for a gate structure capable of reducing the short channel effect and a multi-bit structure capable of storing 2-bit or more data.

SUMMARY OF THE INVENTION

Accordingly, the present invention has been made in view of the above problems occurring in the prior art, and it is an object of the present invention to provide a multi-bit non-volatile memory device employing a dual gate structure, and method of manufacturing the same.

It is another object of the present invention to provide program/erase/read conditions for a multi-bit cell operation of a multi-bit non-volatile memory device employing a dual gate structure.

A method of manufacturing a multi-bit non-volatile memory device having a dual gate structure according to an aspect of the present invention comprises the steps of (a) sequentially forming a silicon substrate, a lower insulating film and silicon, (b) patterning the hard mask pattern and the silicon using a mask so that U shapes are opposite to each other at the center of the silicon, whereby a silicon pin in which a source region and a drain region are formed on both sides on the basis of the center of the silicon, (c) stripping the hard mask pattern, growing a tunneling oxide film through an oxidization process, and sequentially growing an electron trap film for trapping electrons and a control oxide film on the tunneling oxide film, (d) depositing a gate material of a poly-silicon or metal material on the film structure and then injecting an impurity or metal material, (e) etching the gate material deposited on the silicon pin to separate gate regions that are combined in the (d) step, (f) forming a gate mask on the silicon pin and patterning the gate regions using a gate mask, and (g) injecting an impurity in order to form source/drain regions in the silicon pin.

Furthermore, the hard mask pattern in the step (b) may have an H shape in which U shapes are opposite to each other at the center.

Furthermore, in the step (b), the silicon pin may be formed to have a shape having corners at the combine region of the source/drain regions.

Furthermore, in the step (b), the silicon pin may be formed to have a different width depending on a location.

Furthermore, when growing the tunneling oxide film in the step (c), oxygen ion may be injected into both sides on the basis of the center of the silicon pin at a controlled implantation angle.

Furthermore wherein when growing the tunneling oxide film in the step (c), high-k materials with different dielectric constants on both surfaces on the basis of the silicon pin.

Furthermore, the charge trap film in the step (c) may be formed to have an Oxide/Nitride/Oxide (ONO) structure in which a nitride film and a control oxide film are sequentially deposited on the tunneling oxide film.

Furthermore, the charge trap film in the step (c) may be formed to have a floating gate memory structure using one or more of silicon, germanium and metal nanocrystal.

Meanwhile, the step (d) of injecting the impurity, injecting a n+ type impurity into one of gates on the basis of the center of the silicon pin at a controlled implantation angle.

The method may further comprise the step of depositing a screen oxide layer on the dual gate, injecting ion and then removing the screen oxide layer in order to remove a channeling effect in which ion reaches the silicon substrate through the dual gate when an impurity is injected.

Meanwhile, the step (d) of injecting the metal materials with different work functions on both surfaces on the basis of the center of the silicon pin at a controlled implantation angle.

The metal materials with the different work functions may comprise a metal material having a work function of 5 eV or high and a metal material having a work function of 4 eV or less.

Furthermore, in the step (d), after an undoped gate material and a metal material are sequentially deposited, different types of impurities, of an n type or p type, may be implanted into both sides on the basis of the center of the silicon pin by controlling the implantation angle of the impurity (large angle tilted implantation) and a subsequent thermal process may be then performed.

Furthermore, in the step (d), after an undoped gate material is deposited, different types of impurities may be implanted into both sides on the basis of the silicon pin by controlling the implantation angle of the impurity, the metal material may be deposited on the gate material arid silicide having different work functions may be then formed through a subsequent thermal process.

Meanwhile, in the step (d), after nickel is deposited on a gate material that is doped with an implantation angle being controlled as an n type and a p type, NiSi may be formed through a subsequent thermal process to form a metal electrode having a work function of 4 eV on one side and to form a metal electrode having a work function of 5 eV on the other side.

In this case, in the step (d) of implanting the impurity for forming the dual gate, in the case where a dual gate having an asymmetrical equivalent tunneling oxide film and an asymmetrical work function is formed, after an n type impurity having a high concentration of a n+ type is implanted deep into the silicon pin where the dual gate on which a thin equivalent tunneling oxide film will be grown will be formed at a controlled implantation angle, a p type impurity having a low concentration of a p– type may be implanted deep into the silicon pin in which a gate on which a thick equivalent tunneling oxide film will be grown will be formed at a controlled implantation angle, and a p type impurity having a high concentration of a p+ type is implanted shallowly into the silicon pin in which the same gate will be formed at a controlled implantation angle.

In this case, in the step (d) of implanting the impurity for forming the dual gate, in the case where a dual gate having an asymmetrical equivalent tunneling oxide film and an asymmetrical work function is formed, after a p type impurity having a high concentration of a p+ type is implanted deep into the silicon pin where a gate on which a thin equivalent tunneling oxide film will be grown will be formed at a controlled implantation angle, an n type impurity having a low concentration of a n– type may be implanted deep into the silicon pin in which a gate on which a thick equivalent tunneling oxide film will be grown will be formed at a controlled implantation angle, and an n type impurity having a high concentration of a n+ type may be implanted shallowly into the silicon pin in which the same gate will be formed at a controlled implantation angle.

Furthermore, the step of implanting the impurity may further comprise the step of depositing a screen oxide layer on the dual gate, injecting ion and then removing the screen oxide layer.

Meanwhile, the step of implanting the impurity may further comprise the step of depositing a screen oxide layer on the dual gate, injecting ion and then removing the screen oxide layer.

Meanwhile, the step (g) of implanting the impurity in order to form the source/drain regions may comprise the step of implanting the impurity only in one direction where the source/drain regions will be formed on the basis of the center of the silicon pin.

Meanwhile, in accordance with another aspect of the present invention, the objects can also be accomplished by a multi-bit non-volatile memory device having a dual gate structure, which is comprising: a silicon substrate; a lower insulating film is formed on the silicon substrate; a silicon layer is formed on the lower insulating film and, having a silicon pin at the center of the silicon in which a source region and a drain region are formed on both sides and the silicon pin is formed to have a shape having corners at the combine region of the source/drain regions; sequentially formed tunneling oxide film, electron trap film and a control oxide film on the basis of the center of the silicon pin; gate materiel on the control oxide film on the basis of the center of the silicon pin.

Furthermore, in accordance with The memory device, wherein the source/drain regions asymmetrically formed in the silicon channel, and the silicon pin is formed to have a wide region at the source region than drain region.

Furthermore, the memory device, wherein the tunneling oxide films on the both side of the silicon pin having a different width or dielectric constants.

Furthermore, the memory device, wherein the tunneling oxide films on the both side of the silicon pin having a different width or dielectric constants.

Furthermore, in accordance with another aspect of the present invention, the objects can also be accomplished by a method of operating a multi-bit non-volatile memory device having a dual gate structure, wherein in a program operation for implanting electrons into the electron trap film, a high voltage is applied to a source or drain that tries to trap electrons, thus generating hot electrons, and hot electrons generated through a gate voltage are pulled toward the gate so that the electrons are trapped at the electron trap film of the source or drain-side silicon pin corners.

Furthermore, in accordance with further another aspect of the present invention, the objects can also be accomplished by a method of operating a multi-bit non-volatile memory device having a dual gate structure, wherein in an erase operation of electrons trapped at the electron trap film, a method of applying a high voltage to a source or drain that tries to erase electrons, applying a minus (–) voltage to the gate so that holes generated by tunneling are trapped at the electron trap film of the source or drain-side silicon pin corners, and combining the trapped holes with electrons that have been trapped in the program operation and then erasing the holes is employed.

Furthermore, in accordance with further another aspect of the present invention, the objects can also be accomplished by a method of operating a multi-bit non-volatile memory device having a dual gate structure, wherein in a read operation of electrons trapped at the electron trap film, values of threshold voltages between a normal direction read ($V_D$>$V_S$) condition and a reverse direction read ($V_D$<$V_S$) condition are different depending on a location where the electrons are trapped.

In this case, in the case where a read operation is performed on a program in which electrons are trapped at the electron trap film of drain-side silicon pin corners, the reverse direction read ($V_D$<$V_S$) condition having an opposite direction to that of an operating voltage ($V_D$>$V_S$) of the program may be employed. In the case where a read operation is performed on a program in which electrons are trapped at the electron trap film of source-side silicon pin corners, the normal direction read ($V_D$>$V_S$) condition having an opposite direction to that of an operating voltage ($V_D$<$V_S$) of the program may be employed.

Furthermore, in accordance with further another aspect of the present invention, the objects can also be accomplished by a method of operating a multi-bit non-volatile memory device having a dual gate structure, in a read operation, a 2-bit operation can be implemented using both normal and reverse direction read conditions.

Furthermore, in accordance with further another aspect of the present invention, the objects can also be accomplished by a method of operating a multi-bit non-volatile memory device having a dual gate structure, in a read operation, a 2-bit operation can be implemented employing any one of normal and reverse direction read conditions by using different threshold voltages.

In this case, in the read operation, a 3-bit operation can be implemented using both the normal and reverse direction read conditions.

Furthermore, in accordance with further another aspect of the present invention, the objects can also be accomplished by a method of operating a multi-bit non-volatile memory device having a dual gate structure, in a read operation, a 4-bit operation can be implemented using both normal and reverse direction read conditions.

Furthermore, in accordance with further another aspect of the present invention, the objects can also be accomplished by a method of operating a multi-bit non-volatile memory device having a dual gate structure, in a read operation, a 4-bit operation can be implemented employing any one of normal and reverse direction read conditions by using different threshold voltages.

In this case, in the read operation, a 5-bit operation can be implemented using both the normal and reverse direction read conditions.

BRIEF DESCRIPTION OF THE DRAWINGS

A more compete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF PREFERRED EMBODIMENTS

Figure 1A:
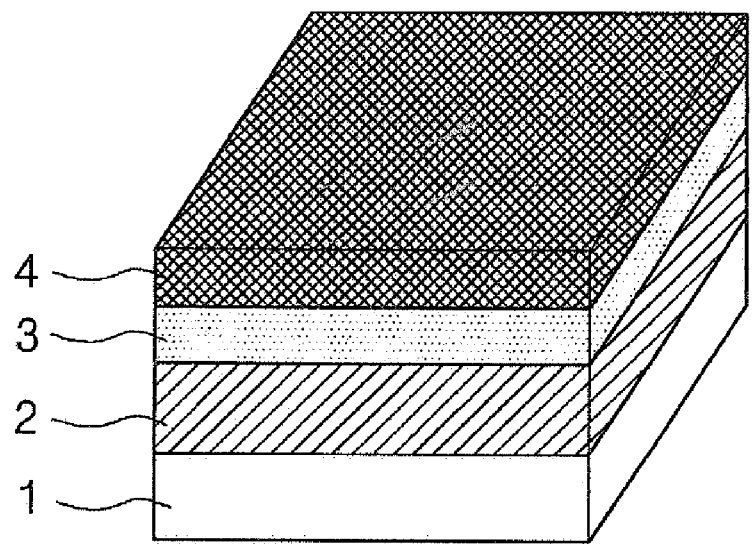
FIGS. 1a to 1g are perspective views sequentially illustrating a method of manufacturing a multi-bit non-volatile memory device having a dual gate structure according to an embodiment of the present invention.

In the following detailed description, only certain exemplary embodiments of the present invention have been shown and described simply by way of illustration. As those skilled in the art will realize, the described embodiment may be modified in various different ways, all without departing from the spirit or scope of the present invention. Accordingly, the drawings and description are to be regarded as illustrative in nature and not restrictive. Like reference numerals designate like elements throughout.

FIGS. 1a to 1g are perspective views sequentially illustrating a method of manufacturing a multi-bit non-volatile memory device having a dual gate structure according to an embodiment of the present invention.

Referring to FIG. 1a, to fabricate the multi-bit non-volatile memory device having the dual gate structure, a silicon substrate 1, a lower insulating film 2, silicon 3 and a hard mask 4 are sequentially laminated. The hard mask 4 may be formed using a material that will not be etched in a subsequent silicon anisotropic etching.

Figure 1B:
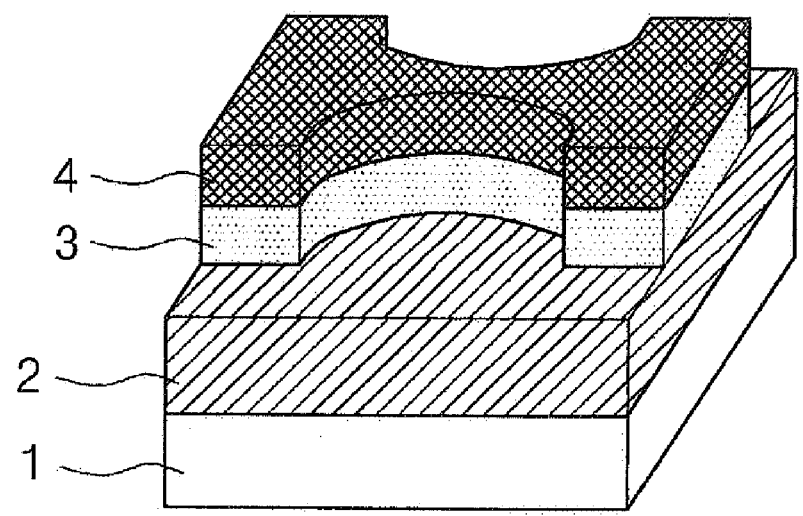

Referring to FIG. 1b, the silicon pin 3 is anistropically etched using the hard mask 4 pattern as a mask to form a pattern of a silicon pin 3 in which a channel will be formed and a silicon region in which the source/drain will be formed. Accordingly, when viewed from a plan view, patterns in which U shapes are opposite to each other at the center of the substrate are removed whereby the silicon pin 3 has an "H" shape. Therefore, a width of the channel is varied depending on a location and a channel width at the central portion becomes narrower than that on the source or drain side.

Figure 1C:
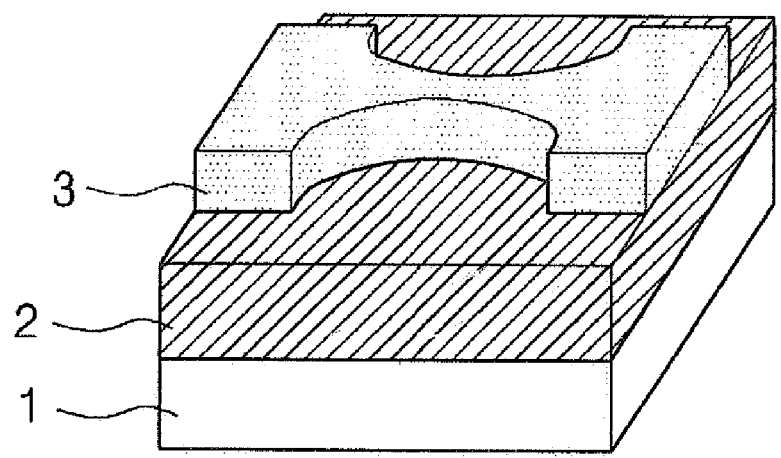

Referring to FIG. 1c, after the hard mask 4 is stripped, a tunneling oxide film is grown using an oxidization process. To capture electrons, a nitride film and a control oxide film are sequentially deposited. A structure in which the tunneling oxide film, the nitride film and the control oxide film are sequentially deposited (hereinafter, referred to as "'ONO (Oxide/Nitride/Oxide) structure") is a film structure for trap electrons. The structure is formed between the silicon pin 3 and the gate which will be formed in a subsequent process.

Alternatively, a method of implanting oxygen ion into the silicon pin 3 in which the gate on which a thick tunneling oxide film will be grown will be formed, at a controlled implantation angle, and oxidizing the silicon pin 3 may be used in order to grow a tunneling oxide film having an asymmetrical thickness, instead of the method of growing the tunneling oxide film having the same thickness. At this time, the implantation angle can be 45° or higher.

Alternatively, in addition to the method of growing the tunneling oxide film having the same thickness, a method of obliquely depositing high-k (a high dielectric constant) materials with different dielectric constants on both sides of the silicon pin 3 (oblique sputtering or evaporation) may be used in order to form a tunneling oxide film having an asymmetrical Effective Oxide Thickness (EOT). At this time, the deposition angle may be 45° or greater.

The high-k material may comprise $Al_2O_3$, $ZrO_2$, $HfO_2$ or the like. It is preferred that two high-k materials used have a high dielectric constant ratio. Furthermore, a method of obliquely inserting the substrate into a high-k material deposition apparatus or rotating a chuck in which the substrate is mounted may be used instead of the method of obliquely depositing the high-k materials.

In addition, to capture electrons, a floating gate memory structure employing silicon, germanium and metal nanocrystal may be used instead of the ONO structure employing the nitride film.

Figure 1D:
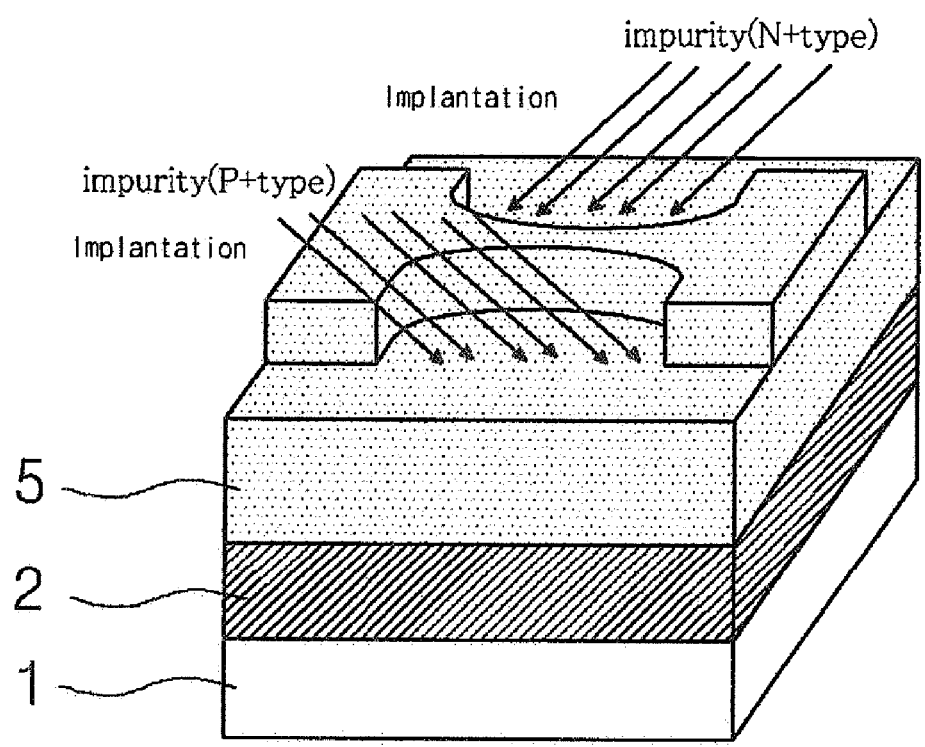

Referring to FIG. 1d, after a gate material 5 is deposited, an impurity is implanted in order to form a dual gate having the same work function.

In the step of implanting the impurity in order to form the gate, after an undoped gate material 5 is deposited, an n+ type impurity may be implanted into one of the gates at a controlled implantation angle without an additional mask process in order to form the dual gate having an asymmetrical work function. Alternatively, a p+ type impurity may be implanted into a gate having a type opposite to an n+ type at a controlled implantation angle without an additional mask process. At this time, the implantation angle can be 45° or greater.

At this time, the gate material 5 may be formed using polysilicon. The n type impurity may be As or P. The p type impurity may be B or $BF_2$.

Furthermore, to remove a channeling effect in which ions reach the substrate through the gate when implanting the impurity, a step in which after a screen oxide layer is deposited on the gate, impurity ions with different types are implanted and the screen oxide layer is removed may be further comprised.

Furthermore, in the step of forming the gate, a method of obliquely depositing metal materials with different work functions on both sides on the basis of the center of the silicon pin 3 (oblique sputtering or evaporation) may be employed in order to form the dual gate having the asymmetrical work function. At this time, the deposition angle can be 45° or higher. The two metal materials deposited on both sides on the basis of the center of the silicon pin 3 may have a great difference in the work function.

For example, metal having a work function of 4 eV or less may be deposited on one side on the basis of the center of the silicon pin 3, and metal having a work function of 5 eV or higher may be deposited on the other side on the basis of the center of the silicon pin 3.

Even in this case, a method of obliquely inserting the substrate into a metal deposition apparatus or rotating a chuck in which the substrate is mounted may be used instead of the method of obliquely depositing the metal materials.

After undoped polysilicon and metal are sequentially deposited, impurities having a different n or p type may be implanted into both sides on the basis of the center of the silicon pin 3 at a controlled impurity implantation angle (large angle tilted implantation) and then undergo a subsequent thermal process.

At this time, after the undoped polysilicon is deposited, impurities having different types may be implanted into both sides of polysilicon (i.e., a gate material) on the basis of the center of the silicon pin 3 at a controlled impurity implantation angle and metal may be deposited on the polysilicon (i.e., the gate material). Silicide having different work functions may be then formed using a subsequent thermal process.

For example, after nickel is deposited on polysilicon into which gates of an n type and a p type are doped at a controlled implantation angle, NiSi is formed by a subsequent thermal process. Accordingly, a metal electrode having a work function of 4 eV can be formed on one side and a metal electrode having a work function of 5 eV can be formed on the other side.

Furthermore, in the step of implanting the impurity in order to form the gate, to form an asymmetrical equivalent tunneling oxide film and a dual gate having an asymmetrical work function, a high concentration impurity of a n+ type may be implanted deep into the silicon pin 3 in which the gate on which a thin equivalent tunneling oxide film will be grown will be formed, at a controlled implantation angle. A low concentration impurity of a p− type may be then implanted deep into the silicon pin 3 in which the gate on which a thick equivalent tunneling oxide film will be grown will be formed at a controlled implantation angle. Thereafter, a high concentration impurity of a p+ type may be shallowly implanted into the silicon pin 3 in which the same gate will be formed at a controlled implantation angle. At this time, the implantation angle of each impurity can be 45° or higher. A gate doping concentration at the p− and p+ dual implanted PMOS interface is low compared with NMOS implanted with an n+ type of sufficient concentration and energy. Accordingly, a poly depletion effect is greatly generated in the p− and p+ dual implanted PMOS interface. As a result, an equivalent tunneling oxide film thickness of the gate of PMOS is thicker than that of NMOS.

On the other hand, to form a dual gate having a symmetrical work function to an asymmetrical equivalent tunneling oxide film, a high concentration impurity of a p+ type may be implanted deep into the silicon pin 3 in which the gate on which a thin equivalent tunneling oxide film will be grown will be formed, at a controlled implantation angle. A low concentration impurity of a n− type may be then implanted deep into the silicon pin 3 in which the gate on which a thick equivalent tunneling oxide film will be grown will be formed at a controlled implantation angle. Thereafter, a high concentration impurity of a n+ type may be shallowly implanted into the silicon pin 3 in which the same gate will be formed at a controlled implantation angle.

Figure 1E:
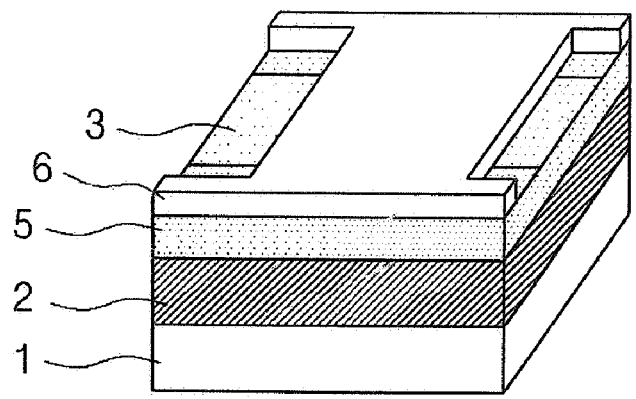

Referring to FIG. 1e, the gate material 5 remaining on the top of the silicon pin 3 is etched by Chemical Mechanical Polishing (CMP), thereby separating the combined gate. The gate mask 6 is then patterned in order to form a gate region.

Figure 1F:
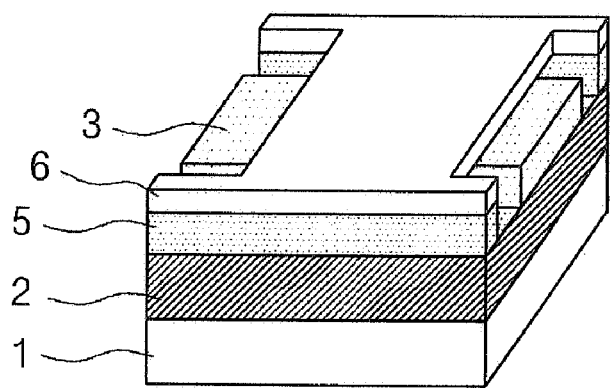

As shown in FIG. 1f, the gate region is formed using the patterned gate mask 6. At this time, the gate material 5 may be selectively etched using an oxide film which is formed when the tunneling oxide film is grown on the silicon region 3.

An impurity is then implanted in order to form source/drain regions.

At this time, to form asymmetrical source/drain regions, a method of implanting an impurity only in one direction on the basis of the source/drain regions may be used. An implantation angle can be 45° or less.

Figure 1G:
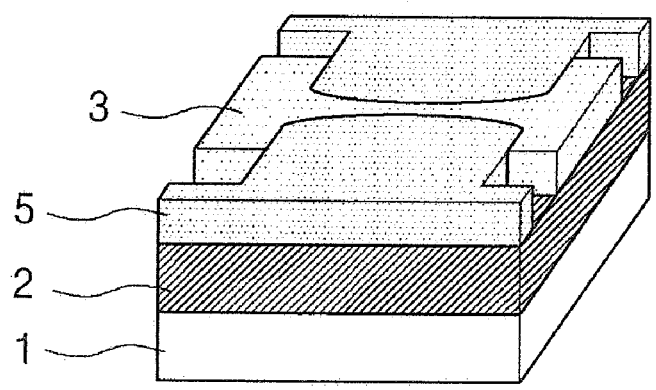

Through the above process, the multi-bit non-volatile memory device having the dual gate according to an embodiment of the present invention is completed as shown in FIG. 1g.

Figures 2A, 2B:
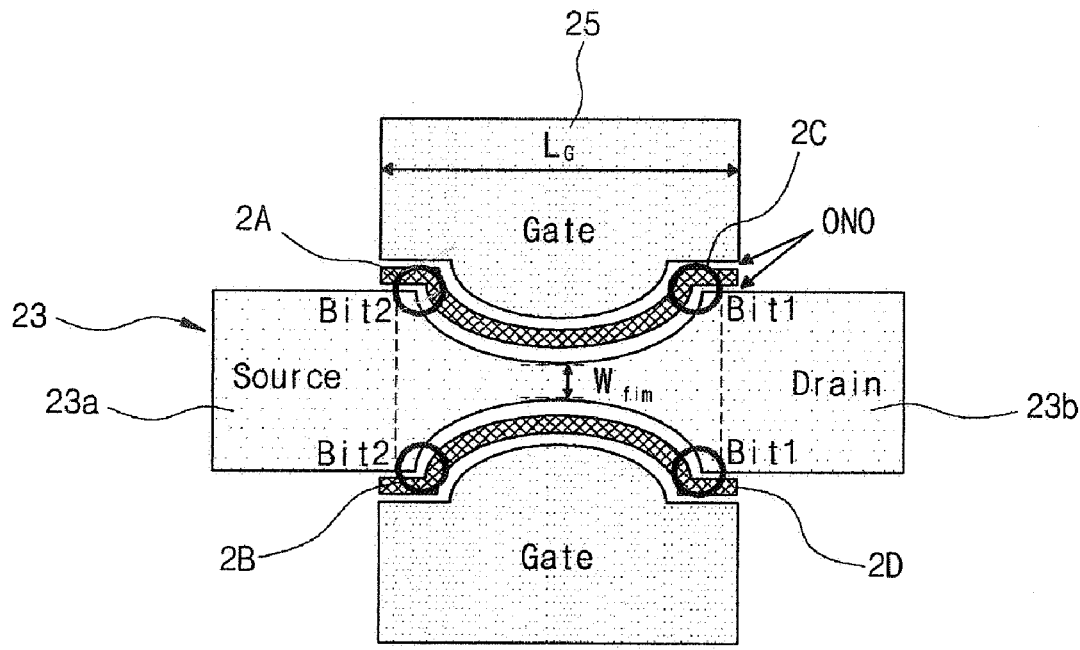
FIG. 2a is a cross-sectional view of a 2-bit non-volatile memory device of the dual gate structure, which employs local charge trap and normal/reverse direction read conditions, according to a first embodiment of the present invention.
FIG. 2b is a table illustrating program/erase/read conditions for an operation.
Figure 2C:
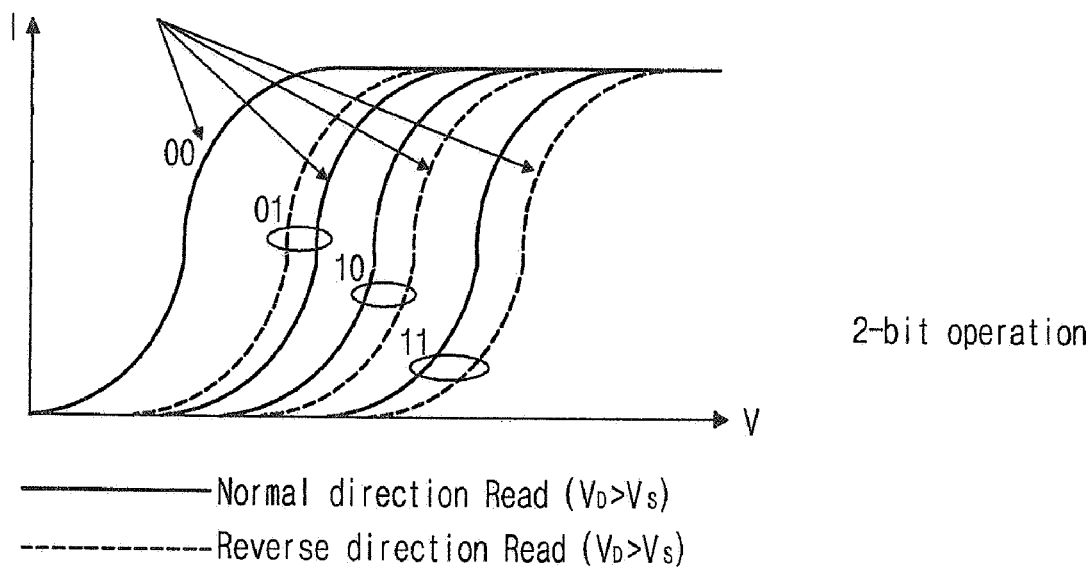
FIG. 2c is a graph illustrating voltage and current characteristics depending on logic values.

FIG. 2a is a cross-sectional view of a 2-bit non-volatile memory device of the dual gate structure, which employs local charge trap and normal/reverse direction read conditions, according to a first embodiment of the present invention, FIG. 2b is a table illustrating program/erase/read conditions for an operation, and FIG. 2c is a graph illustrating voltage and current characteristics depending on logic values.

There is shown in FIG. 2a the cross-sectional view of the 2-bit non-volatile memory device in which electric charges are trapped by employing a shape in which a silicon pin 23 is formed in H form and the corners of the silicon pin 23 are surrounded by a dual gate 25 and an ONO structure formed between the dual gate 25 and the silicon pin 23.

In this structure, electrons are locally trapped at the corners 2A, 2B, 2C and 2D of the silicon pin 23 in the program operation due to hot electron injection by using a phenomenon in which an E-field is concentrated on the corners of the silicon pin 23 and a phenomenon in which more hot carrier injection is generated as the silicon pin 23 becomes thick.

The dual gate 25 is applied with the same voltage. A case where electrons are trapped at the drain (23b)-side silicon corners 2C, 2D will be defined as "Bit1" and a case where electrons are trapped at the source (23a)-side silicon corners 2A, 2B will be defined as "Bit2".

FIG. 2b is a table illustrating program (P)/erase (E)/read (R) conditions for an operation. The parameters may be defined as follows.

A voltage applied to the dual gate 25 for the program operation will be defined as "$V_{WP}$".

A voltage applied to the source 23a or the drain 23b for the program operation will be defined as "$V_{BP}$".

A voltage applied to the dual gate 25 for the erase operation will be defined as "$V_{WE}$".

A voltage applied to the source 23a or the drain 23b for the erase operation will be defined as "$V_{BE}$".

A voltage applied to the dual gate 25 for the read operation will be defined as "$V_{WR}$".

A voltage applied to the source 23a or the drain 23b for the read operation will be defined as "$V_{DD}$".

The program operation employs a method of generating hot electrons by applying a high $V_{BP}$ voltage to a place (the drain or source side) where the hot electrons will be trapped and dragging hot electrons generated by applying a high gate voltage toward the dual gate 25 whereby the electrons are trapped at the nitride film of the source (23a) or drain (23b)-side silicon corners.

The erase operation employs a method of applying a high $V_{BE}$ voltage to a place (the drain or source side) where electrons will be trapped, applying a minus voltage to the dual gate 25 so that electrons generated by band-to-band (BTB) tunneling are pulled toward the dual gate 25, whereby the electrons are trapped at the nitride film of the source (23a) or drain (23b)-side silicon corners and are recombined with exist trapped electrons.

The read operation may be divided into normal ($V_D>V_S$) and reverse direction read ($V_D<V_S$) methods. To read Bit1 in which electrons are trapped at the drain (23b)-side silicon corners 2C, 2D, the reverse direction read method having a direction opposite to that of the operating voltage ($V_D>V_S$) of the program is employed. To read Bit2 in which electrons are trapped at the source (23a)-side silicon corners 2A, 2B, the normal direction read method having a direction opposite to that of the program operating voltage ($V_D<V_S$) is employed.

Assuming that a threshold voltage when a region where electrons are trapped through the program operation is applied with ground and a region where electrons are not trapped is applied with the operating voltage ($V_{DD}$) is "$V_{TR2}$" and a threshold voltage before the program is "$V_{TR1}$", and a threshold voltage when a region where electrons are trapped through the program operation is applied with the operating voltage ($V_{DD}$) and a region where electrons are not trapped is applied with the ground is "$V_{TR2}$" and a threshold voltage before the program is "$V_{TN1}$", a method satisfying the following Equation may be employed.

$$V_{TR2}-V_{TR1}>V_{TN2}-V_{TN1} \qquad \text{[Equation 1]}$$

This principle has been known as a method called "source/drain swapping" for determining whether the hot carrier effect has occurred. The gate voltage ($V_{WR}$) is a voltage for the read operation and is therefore lower than the voltage ($V_{WP}$) used to inject hot electrons.

FIG. 2c is a graph illustrating voltage and current characteristics depending on logic values. In this graph, it is assumed that an amount of electrons trapped at the source (23a)-side silicon corners 2A, 2B corresponding to "bit2" is smaller than an amount of electrons trapped at the drain (23b)-side silicon corners 2C, 2D corresponding to "bit1".

Therefore, logic "00" shows a similar threshold voltage as that of the erase condition since an amount of electrons trapped at the oxide film interface or the nitride film of the source (23a)-side silicon corners 2A, 2B and the drain (23b)-side silicon corners 2C, 2D is very small. Furthermore, in logic "00", since the electron trap condition is the same as the doping profile of the drain 23b and the source 23a, the threshold voltage is the same in the normal direction read and the reverse direction read.

Logic "01" corresponds to a case where electrons are trapped at the oxide film interface or the nitride film of the source (23a)-side silicon corners 2A, 2B corresponding to "bit2" (upon program, $V_D<V_S$). An increase in the threshold voltage is greater in the normal direction read ($V_D>V_S$) than in the reverse direction read ($V_D<V_S$).

Logic "10" corresponds to a case where electrons are trapped at the oxide film interface or the nitride film of the drain (23b)-side silicon corners 2C, 2D corresponding to "bit1" (upon program, $V_D>V_S$). An increase in the threshold voltage is greater in the reverse direction read ($V_D<V_S$) than in the normal direction read ($V_D>V_S$). Furthermore, since the amount of electrons trapped at the drain (23b)-side silicon corners 2C, 2D corresponding to "bit1" is greater than the amount of electrons trapped at the source (23a)-side silicon corners 2A, 2B corresponding to "bit2", the threshold voltage is higher in logic "10" than in logic "01".

Logic "11" corresponds to a case where electrons are trapped at the oxide film interface or the nitride film of the drain 23b and source (23a)-side silicon corners 2A, 2B. 2C and 2D corresponding to "bit1" and "bit2". In the read operation, the threshold voltage is the highest. Furthermore, since the amount of electrons trapped at the drain (23b)-side silicon corners 2C, 2D corresponding to "bit1" is greater than the amount of electrons trapped at the source (23a)-side silicon corners 2A, 2B corresponding to "bit2", an increase in the threshold voltage is greater in the reverse direction read ($V_D<V_S$) than in the normal direction read ($V_D>V_S$).

Accordingly, for the purpose of the 2-bit operation employing the memory structure of FIG. 2a, respective logics can be easily determined by using the normal direction or reverse direction condition when reading logic "00", the normal direction read condition when reading logic "01", and the reverse direction condition when reading logic "10" and logic "11".

Figure 3A:
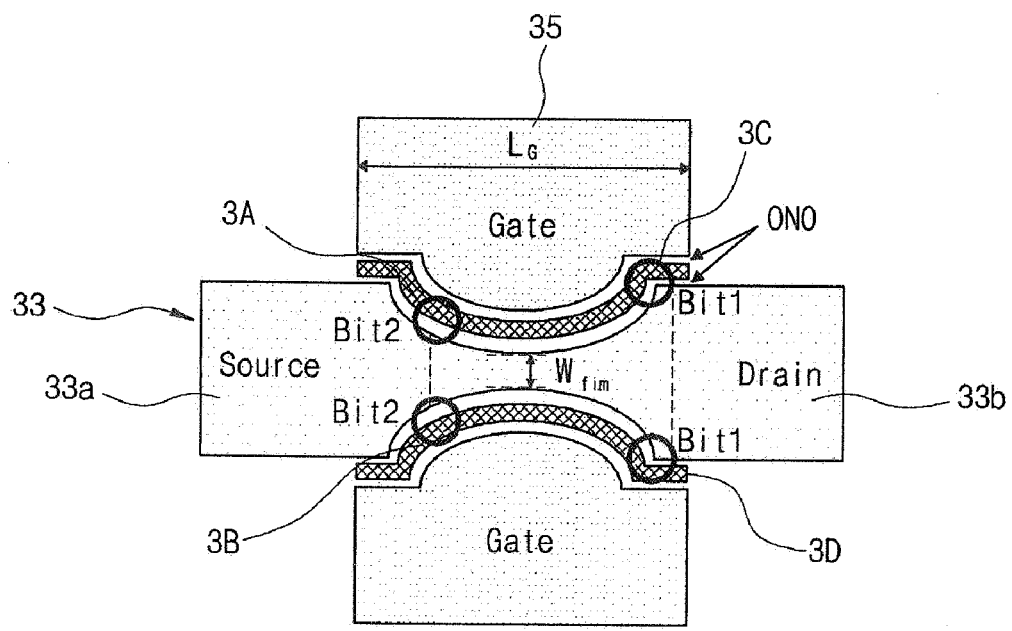
FIG. 3a is a cross-sectional view of a 2-bit non-volatile memory device of the dual gate structure, which employs local charge trap and only a normal direction read condition according to an embodiment of the present invention.
Figures 3B, 3C:
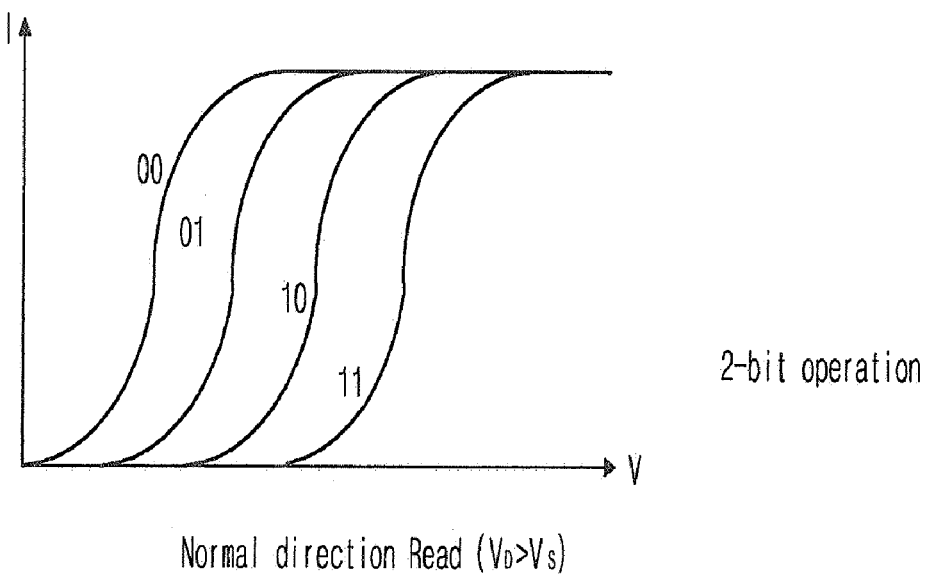
FIG. 3b is a table illustrating program/erase/read conditions for an operation.
FIG. 3c is a graph illustrating voltage and current characteristics depending on logic values.

FIG. 3a is a cross-sectional view of a 2-bit non-volatile memory device of the dual gate structure, which employs local charge trap and only a normal direction read condition according to an embodiment of the present invention, FIG. 3b is a table illustrating program/erase/read conditions for an operation, and FIG. 3c is a graph illustrating voltage and current characteristics depending on logic values.

There is shown in FIG. 3a the cross-sectional view of the 2-bit non-volatile memory device in which electric charges are trapped by employing a shape in which a silicon pin 33 is formed in H form and the corners of the silicon pin 33 are surrounded by a dual gate 35 and an ONO structure formed between the dual gate 35 and the silicon pin 33.

The structure of the 2-bit the non-volatile memory device shown in FIG. 3a is a structure in which the same voltage is applied to the dual gate 35 and is thus similar to that of FIG. 2a. In this structure, however, the source (33a) and drain (33b) regions are asymmetrically formed and only the drain (33b) region employs a phenomenon in which charges are trapped at the corners of the silicon pin 33. In addition, since the drain (33b)-side silicon pin 33 is thicker than the source (33a)-side silicon pin 33, more hot carriers can be injected.

Therefore, an amount of electrons trapped at a local oxide film interface or a nitride film (i.e., the drain (33b)-side junction edges 3C, 3D) corresponding to "bit1" is greater than an amount of electrons trapped at an oxide film interface or nitride film (i.e., the source (33a)-side junction edges 3A, 3B) corresponding to "bit2".

FIG. 3b is a table illustrating program (P)/erase (E)/read (R) conditions for an operation. The parameters and operating principle are the same as those of FIG. 2b.

The structure of FIG. 2a is a symmetric source/drain structure in which a difference between amounts of electrons trapped at the oxide film interface or the nitride film (i.e., the junction edges 2A, 2B, 2C and 2D on the part of the source 23a and the drain 23b) is not great, whereas the structure of FIG. 3a is an asymmetric source/drain structure in which a difference between an amount of electrons trapped on the drain (33b) side and an amount of electrons trapped on the source (33a) side is great. Accordingly, the whole read speed can be increased by employing only the normal direction read (i.e., 1-read condition not 2-read condition employing both the normal and reverse directions).

FIG. 3c is a graph illustrating voltage and current characteristics depending on logic values. In this graph, it is assumed that an amount of electrons trapped at the local oxide film interface or the nitride film of the source (33a)-side junction edges 3A, 3B corresponding to "bit2" is smaller than an amount of electrons trapped at the local oxide film interface or the nitride film of the drain (33b)-side junction edges 3C, 3D corresponding to "bit1".

In this case logic "00" shows a threshold voltage similar to that of the erase condition over the whole device since the amount of electrons trapped at the local oxide film interface or the nitride film of the source (33a)-side junction edges 3A, 3B and the drain (33b)-side junction edges 3C, 3D is very small.

Logic "01" corresponds to a case where electrons are trapped at the local oxide film interface or the nitride film of the source (33a)-side junction edges 3A, 3B corresponding to "bit2". Accordingly, a threshold voltage is higher in logic "01" than in logic "00" in the read operation.

Logic "10" corresponds to a case where electrons are trapped at the local oxide film interface or the nitride film of the drain (33b)-side junction edges 3C, 3D corresponding to "bit1". The amount of electrons trapped at the drain (33b)-side silicon corner corresponding to "bit1" is greater than the amount of electrons trapped at the source (3a)-side silicon corner corresponding to "bit2" by way of the corner effect and wide fin effect. Accordingly, a threshold voltage is higher in logic "10" than in logic "01".

Logic "11" corresponds to a case where electrons are trapped at the local oxide film interface or the nitride film of the drain (33b) and source (33a)-side junction edges 3A, 3B, 3C and 3D) corresponding to "bit1" and "bit2". An increase in the threshold voltage is the highest in the read operation.

Therefore, the above-mentioned structure of the non-volatile memory device employs the normal direction read by using an asymmetric source/drain structure in which a difference between the amounts of electrons trapped at the junction edges 3A, 3B, 3C and 3D on the part of the source 33a and the drain 33b is great. Accordingly, there is an advantage in that the read speed can be improved in comparison with a case where an existing 2-read condition is used.

Figures 4A, 4B:
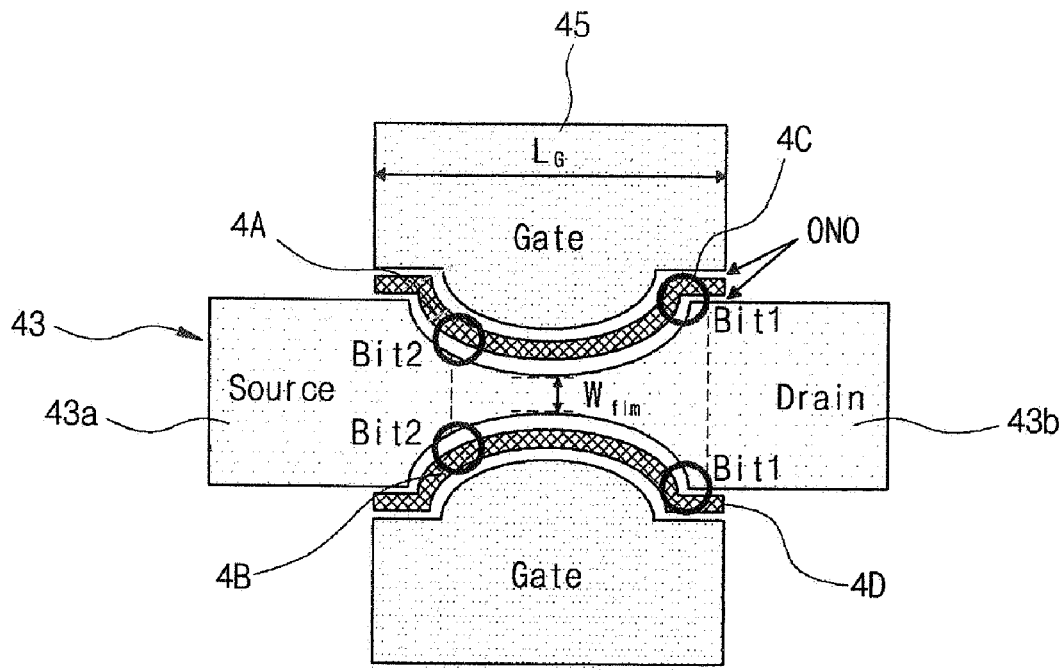
FIG. 4a is a cross-sectional view of a 3-bit non-volatile memory device of the dual gate structure, which employs local charge trap and normal/reverse direction read conditions, according to an embodiment of the present invention.
FIG. 4b is a table illustrating program/erase/read conditions for an operation.
Figure 4C:
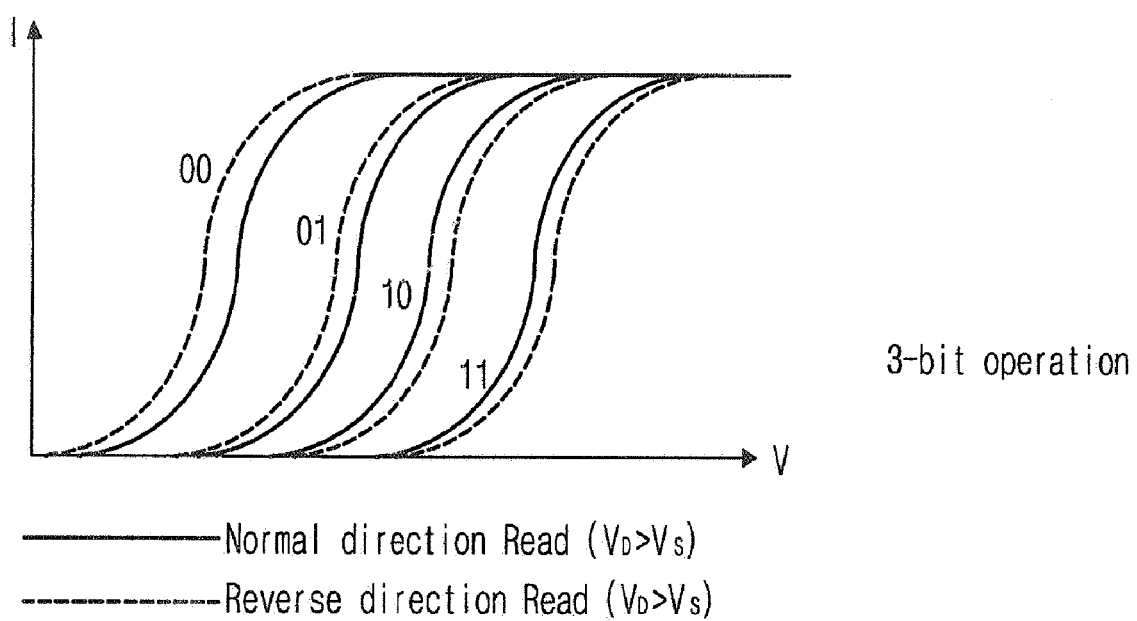
FIG. 4c is a graph illustrating voltage and current characteristics depending on logic values.

FIG. 4a is a cross-sectional view of a 3-bit non-volatile memory device of the dual gate structure, which employs local charge trap and normal/reverse direction read conditions, according to an embodiment of the present invention, FIG. 4b is a table illustrating program/erase/read conditions for an operation, and FIG. 4c is a graph illustrating voltage and current characteristics depending on logic values.

FIG. 4a shows the cross-sectional view of the 3-bit non-volatile memory device in which electric charges are trapped by employing a shape in which a silicon pin 43 is formed in H form and the corners of the silicon pin 43 are surrounded by a dual gate 45, an ONO structure sequentially formed between the dual gate 45 and the silicon pin 43, in the same manner as the structure shown in FIG. 3a, and an asymmetric source/drain structure.

FIG. 4b is a table illustrating program (P)/erase (E)/read (R) conditions for an operation. Regarding the parameters and operating principle, the normal direction and the reverse direction read (i.e., the 2-read condition) are employed in the same manner as FIG. 2b.

The structure of the non-volatile memory device shown in FIG. 4a has the asymmetrical source/drain structure. Accordingly, a difference between an amount of electrons trapped at the drain 43b and an amount of electrons trapped at the source 43a can be increased. The 3-bit operation can be performed employing the 2-read condition.

FIG. 4c is a graph illustrating voltage and current characteristics depending on logic values. In FIG. 4c, the amount of electrons trapped at the local oxide film interface or the nitride film of the source (43a)-side junction edges 4A, 4B corresponding to "bit2" is smaller than the amount of electrons trapped at the local oxide film interface or the nitride film of the drain (43b)-side junction edges 4C, 4D corresponding to "bit1".

Therefore, logic "00" shows a threshold voltage similar to that of the erase condition over the whole device since the amount of electrons trapped at the local oxide film interface or the nitride film of the source (43a) and drain (43b)-side junction edges 4A, 4B, 4C and 4D is very small. At this time, threshold voltages are different from each other in the normal direction read condition (i.e., logic "100") and the reverse direction read condition (i.e., logic "000") since the drain (43b) and source (43a)-side doping profiles employ different asymmetrical structures.

Logic "01" corresponds to a case where electrons are trapped at the local oxide film interface or the nitride film of the source (43a)-side junction edges 4A, 4B (i.e., bit2) (upon program, $V_D<V_S$). In this case, an increase in the threshold voltage is greater in the normal direction read ($V_D>V_S$) (i.e., logic "101") than in the reverse direction read ($V_D<V_S$) (i.e., logic "001").

Logic "10" corresponds to a case where electrons are trapped at the local oxide film interface or the nitride film of the drain (43b)-side junction edges 4C, 4D (i.e., bit1) (upon program, $V_D>V_S$). In this case, an increase in the threshold voltage is greater in the reverse direction read ($V_D<V_S$) (i.e., logic "010") than in the normal direction read ($V_D>V_S$) (i.e., logic "110"). Furthermore, the amount of electrons trapped at the drain (43b)-side silicon corners 4C, 4D corresponding "bit1" is greater than the amount of electrons trapped at the source (43a)-side silicon corners 4A, 4B corresponding to "bit2" due to the corner effect and the wide fin effect of the silicon pin. Accordingly, a threshold voltage is higher in logic "10" than in logic "01" and an amount of the threshold voltage in logic "10" is greater than a difference in the threshold voltage of FIG. 2c.

Logic "11" corresponds to a case where electrons are trapped at the local oxide film interface or the nitride film of the drain (43b) and source (43a)-side junction edges 4A, 4B, 4C and 4D corresponding to "bit1" and "bit2". An increase in the threshold voltage is the highest in the read operation.

Furthermore, the amount of electrons trapped at the drain (43b)-side junction edges 4C, 4D corresponding to "bit1" is greater than the amount of electrons trapped at the source (43a)-side junction edges 4A, 4B corresponding to "bit2" Accordingly, an increase in the threshold voltage is greater in the reverse direction read ($V_D$<$V_S$) (i.e., logic "011") than in the normal direction read ($V_D$>$V_S$) (i.e., logic "111").

Accordingly, the non-volatile memory device that operates as described above can have a 3-bit operation characteristic by employing the asymmetrical source/drain structure in which a difference between the amounts of electrons trapped at the source (43a)- and drain (43b)-side junction edges 4A, 4B, 4C and 4D is great, and the normal direction read and reverse direction read conditions.

Figures 5A, 5B:
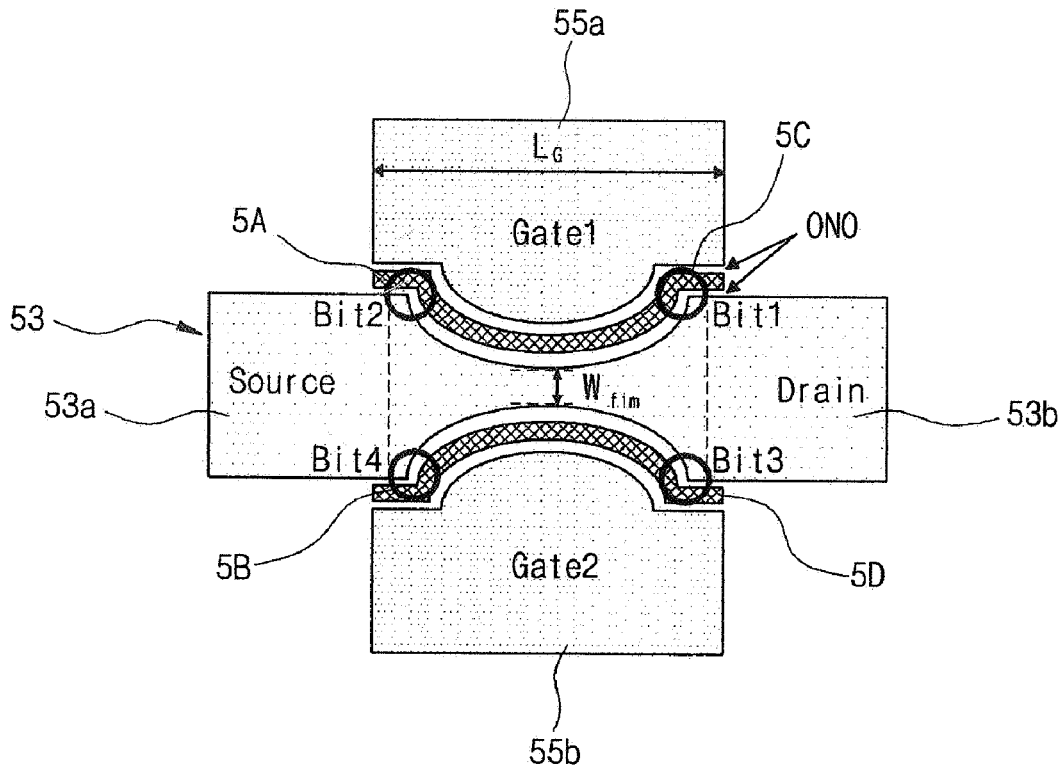
FIGS. 5a and 5b are a cross-sectional view of a 4-bit non-volatile memory device of the dual gate structure, which employs local charge trap and normal/reverse direction read conditions, according to an embodiment of the present invention, and a table illustrating program/read conditions for an operation.

FIGS. 5a and 5b are a cross-sectional view of a 4-bit non-volatile memory device of the dual gate structure, which employs local charge trap and normal/reverse direction read conditions, according to an embodiment of the present invention, and a table illustrating program/read conditions for an operation.

FIG. 5a shows the cross-sectional view of the 4-bit non-volatile memory device in which electrons are trapped by employing a shape in which a silicon pin 53 is formed in H form and the corners of the silicon pin 53 are surrounded by dual gates 55a, 55b, an ONO structure sequentially formed between the dual gates 55a, 55b and the silicon pin 53, and a symmetric source/drain structure.

The 4-bit non-volatile memory device has the same construction as that of FIG. 2a, but has a structure in which different voltages can be applied to the dual gates 55a, 55b. Therefore, it is assumed that a case where electrons are trapped at the oxide film interface or the nitride film of the drain (53b)-side silicon corner 5C of the gate1 55a is "Bit1", a case where electrons are trapped at the oxide film interface or the nitride film of the source (53a)-side silicon corner 5A of the gate1 55a is "Bit2", a case where electrons are trapped at the oxide film interface or the nitride film of the drain (53b)-side silicon corner 5D of the gate2 55b is "Bit3", and a case where electrons are trapped at the oxide film interface or the nitride film of the source (53a)-side silicon corner 5B of the gate2 55b is "Bit4".

FIG. 5b is a table illustrating program (P)/erase (E)/read (R) conditions for the operation of the non-volatile memory device shown in FIG. 5a. The parameters can be defined as follows.

A threshold voltage of the gate1 55a will be defined as "$V_{T1}$".

A threshold voltage of the gate2 55b will be defined as "$V_{T2}$".

A voltage applied to the gate1 55a for the program operation will be defined as "$V_{WP1}$".

A voltage applied to the gate2 55b for the program operation will be defined as "$V_{WP2}$".

A voltage applied to the drain 53b or the source 55a for the program operation will be defined as "$V_{BP}$".

A voltage applied to the gate1 55a for the read operation will be defined as "$V_{WR1}=V_{T1}+V_{DD}$".

A voltage applied to the gate2 55b for the read operation will be defined as "$V_{WR2}=V_{T2}+V_{DD}$".

A voltage applied to the drain 53b or the source 53a for the read operation will be defined as "$V_{DD}$".

In a similar way as the structure of FIG. 2a, the symmetric source/drain structure in which the amounts of electrons trapped at the local oxide film interface or the nitride film of the source (53a)- and drain (53b)-side junction edges 5A, 5B, 5C and 5D is not great is employed. Accordingly, to classify bit1 and bit2, and bit3 and bit4, $V_T$-window of each logic value is widened by employing both the normal direction read condition and the reverse direction read condition (i.e., 2-read condition).

Therefore, in the 4-bit non-volatile memory device shown in FIG. 5a, the voltages applied to the gate1 55a and the gate2 55b can be controlled. Accordingly, the 4-bit non-volatile memory device has a 4-bit operating characteristic by dividing an amount of electrons trapped at the source 53a of the gate1 55a and an amount of electrons trapped at the source 53a of the gate2 55b. Furthermore, to solve a problem in which it is difficult to divide bit1 and bit2, and bit3 and bit4 using the symmetrical source/drain structure, the normal direction read condition and the reverse direction read condition are employed so that respective logics can be easily classified.

To increase a difference in the threshold voltage of bit1 controlled by the gate1 55a and bit3 controlled by the gate2 55b, or bit2 controlled by the gate1 55a and bit4 controlled by the gate2 55b, a method of forming an asymmetrical tunneling oxide film thickness by injecting oxygen ion into the silicon pin 53 where the gate on which a thick tunneling oxide film will be grown will be formed, a method (oblique sputtering or evaporation) of obliquely depositing high-k materials with different dielectric constants on both sides of the silicon pin 53 in order to form a tunneling oxide film having an asymmetrical EOT, a method of employing the poly depletion effect by differentiating the doping profiles of the gate on both sides in order to form an asymmetrical tunneling oxide film or the like may be used. Alternatively, a method of implanting a n+ type impurity into one of gates at a controlled implantation angle and implanting a p+ type impurity into the other of the gates at a controlled implantation angle without an additional mask process so that the gates have different threshold voltages using asymmetric dual gate structures having different work functions or a method (oblique sputtering or evaporation) of obliquely depositing metal materials with different work functions on both sides of the silicon pin 53 may be employed.

Figures 6A, 6B:
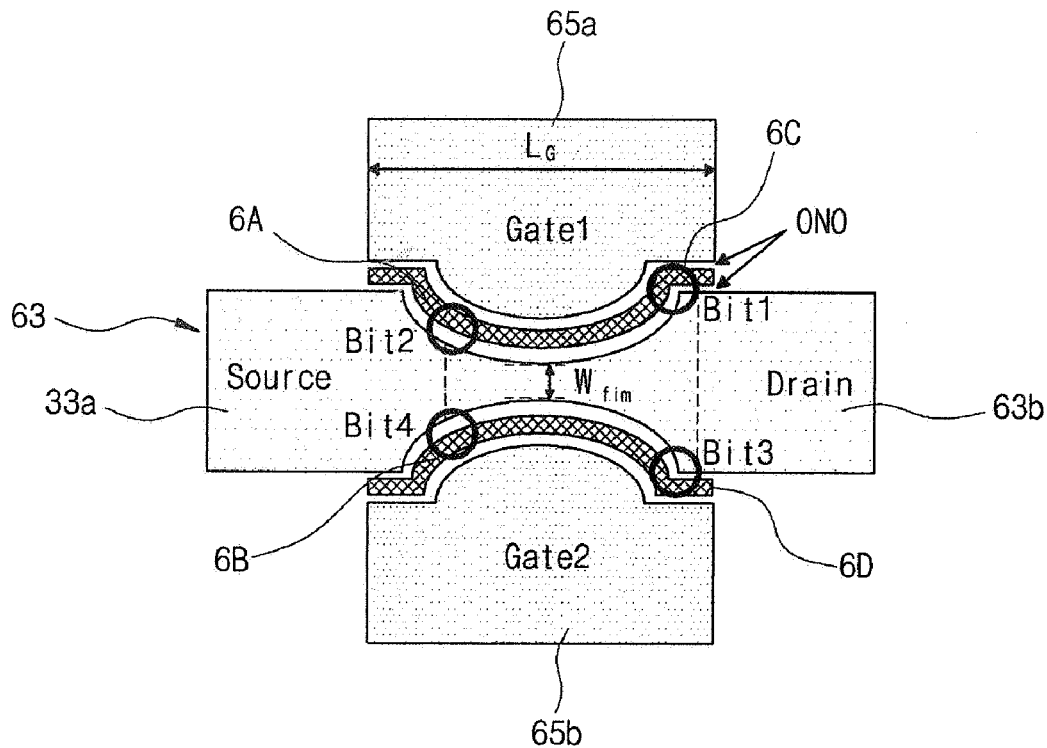
FIGS. 6a and 6b are a cross-sectional view of a 4-bit non-volatile memory device of the dual gate structure, which employs local charge trap and only a normal direction read condition, according to an embodiment of the present invention, and a table illustrating program/read conditions for an operation.

FIGS. 6a and 6b are a cross-sectional view of a 4-bit non-volatile memory device of the dual gate structure, which employs local charge trap and only a normal direction read condition, according to an embodiment of the present invention, and a table illustrating program/read conditions for an operation.

FIG. 6a shows the cross-sectional view of the 4-bit non-volatile memory device in which electrons are trapped by employing a shape in which a silicon pin 63 is formed in H form and central corners of the silicon pin 63 are surrounded by dual gates 66a, 65b, an ONO structure sequentially formed between the dual gates 66a, 65b and the silicon pin 63, and an asymmetric source/drain structure.

The 4-bit non-volatile memory device has the same construction as that of FIG. 3a, but has a structure in which different voltages can be applied to the dual gates 66a, 65b. Therefore, it is assumed that a case where electrons are trapped at the oxide film interface or the nitride film of the drain (63b)-side silicon corner 6C of the gate1 65a is "Bit1", a case where electrons are trapped at the oxide film interface or the nitride film of the source (63a)-side silicon corner 6A of the gate1 65a is "Bit2", a case where electrons are trapped at the oxide film interface or the nitride film of the drain (63b)-side silicon corner 5D of the gate2 65b is "Bit3", and a case where electrons are trapped at the oxide film interface or the nitride film of the source (63a)-side silicon corner 6B of the gate2 65b is "Bit4".

FIG. 6b is a table illustrating program (P)/erase (E)/read (R) conditions for an operation. The parameters and operating principle are the same as those in FIG. 5b.

The structure of the non-volatile memory device shown in FIG. 6a has an asymmetrical source/drain structure. Accordingly, a difference between an amount of electrons trapped at the drain 63b and an amount of electrons trapped at the source 63a can be made great. This can increase the read speed by using only the normal direction read condition (i.e., 1-read condition not 2-read condition).

Therefore, in the 4-bit non-volatile memory device shown in FIG. 6a, the voltages applied to the gate1 66a and the gate2 65b can be controlled. Accordingly, the 4-bit non-volatile memory device has a 4-bit operating characteristic by dividing an amount of electrons trapped at the source 63a of the gate1 66a and an amount of electrons trapped at the source 63a of the gate2 65b. Furthermore, a difference between bit1/bit2 and bit3/bit4 can be discriminated using the asymmetrical source/drain structure in the normal direction read operation.

A method of increasing a difference in the threshold voltage of bit1 controlled by the gate1 66a and bit3 controlled by the gate2 65b, or bit2 controlled by the gate1 66a and bit4 controlled by the gate2 65b is as follows. A method of forming an asymmetrical tunneling oxide film thickness by injecting oxygen ion into the silicon pin 63 where the gate on which a thick tunneling oxide film will be grown will be formed, a method (oblique sputtering or evaporation) of obliquely depositing high-k materials with different dielectric constants on both sides of the silicon pin 63 in order to form a tunneling oxide film having an asymmetrical EOT, a method of employing the poly depletion effect by differentiating the doping profiles of the gate on both sides in order to form an asymmetrical tunneling oxide film or the like may be used. Alternatively, a method of implanting a n+ type impurity into one of gates at a controlled implantation angle and implanting a p+ type impurity into the other of the gates at a controlled implantation angle without an additional mask process so that the gates have different threshold voltages using asymmetric dual gate structures having different work functions or a method (oblique sputtering or evaporation) of obliquely depositing metal materials with different work functions on both sides of the silicon pin 63 may be employed.

Figures 7A, 7B:
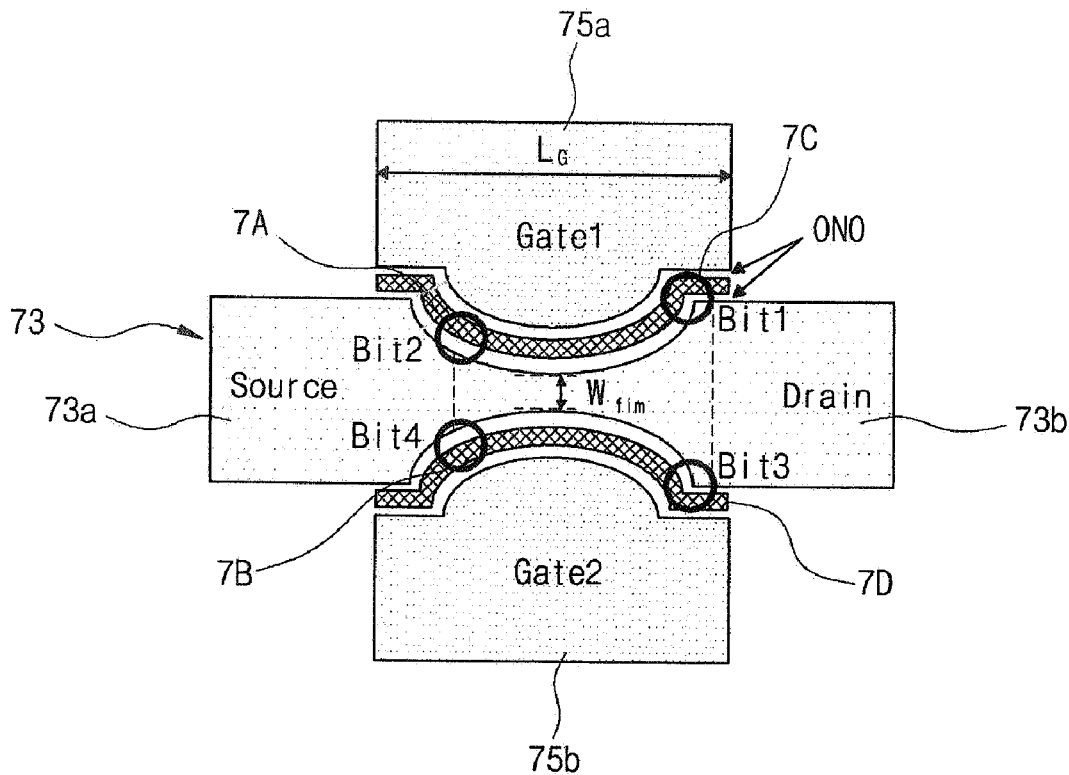
FIGS. 7a and 7b are a cross-sectional view of a 5-bit non-volatile memory device of the dual gate structure, which employs local charge trap and normal/reverse direction read conditions, according to an embodiment of the present invention, and a table illustrating program/read conditions for an operation.

FIGS. 7a and 7b are a cross-sectional view of a 5-bit non-volatile memory device of the dual gate structure, which employs local charge trap and normal/reverse direction read conditions, according to an embodiment of the present invention, and a table illustrating program/read conditions for an operation.

Referring to FIG. 7a, the non-volatile memory device has a silicon pin 73 formed in H form. The non-volatile memory device has the same construction as that of FIG. 6a, in which different voltages can be applied to dual gates 75a, 75b, by using a shape in which corners of the silicon pin 73 is surrounded by the dual gate 75a, 75b, an ONO structure sequentially formed between the dual gates 75a, 75b and the silicon pin 73, and an asymmetrically formed source/drain structure.

Therefore, it is assumed that a case where electrons are trapped at the oxide film interface or the nitride film of the drain (73b)-side silicon corner 7C of the gate1 75a is "Bit1", a case where electrons are trapped at the oxide film interface or the nitride film of the source (73a)-side silicon corner 7A of the gate1 75a is "Bit2", a case where electrons are trapped at the oxide film interface or the nitride film of the drain (73b)-side silicon corner 5D of the gate2 75b is "Bit3", and a case where electrons are trapped at the oxide film interface or the nitride film of the source (73a)-side silicon corner 7B of the gate2 75b is "Bit4".

FIG. 7b is a table illustrating program (P)/read (R) conditions for the operation of the non-volatile memory device shown in FIG. 7a.

At this time, the parameters and operating principle employ the normal direction and reverse direction read conditions (i.e., 2-read condition), which are the same as those of FIG. 5b. In other words, the non-volatile memory device shown in FIG. 7a employs the asymmetrical source/drain structure. Accordingly, a difference between an amount of electrons trapped at the drain (73b)-side silicon corners 7C, 7D as in bit1/bit3 and an amount of electrons trapped at the source (73a)-side silicon corners 7A, 7B as in bit2/bit4. Therefore, the non-volatile memory device shown in FIG. 7a can have a 5-bit operation employing 2-read condition.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

As described above, in accordance with a method of manufacturing a multi-bit non-volatile memory device having a dual gate structure according to the present invention, the process is simple, reappearance is high and high-integration is possible since a FinFET of a 3 dimensional structure is employed. In addition, there is an advantage in that the method of the present invention is compatible with an existing silicon device fabrication process.

Furthermore, multi-bit devices can be fabricated, the performance of devices can be improved and the size of memory devices can be continuously reduced. Accordingly, the present invention is advantageous in that it can contribute to the developments of next-generation memories. In addition, since multi-bit devices of a high density can be integrated, the size of memory devices can be continuously reduced and terra-grade memory devices can be developed accordingly. Accordingly, the present invention greatly affects an overall semiconductor industry.

What is claimed is:

1. A multi-bit non-volatile memory device having a dual gate structure, comprising:
    a silicon substrate;
    a lower insulating film formed over the silicon substrate;
    a silicon layer formed over the lower insulating film and, having a silicon pin at the center of the silicon layer in which a source region and a drain region are formed on both sides of the silicon pin and the silicon pin is formed to have a shape having corners;
    sequentially formed tunneling oxide film, electron trap film and a control oxide film positioned relative to the center of the silicon pin;
    gate material over the control oxide film; and
    wherein the source and drain regions are asymmetrically formed in a silicon channel and the silicon pin is formed to have a wider region at the source region than at the drain region.

2. The memory device of claim 1, wherein each of the tunneling oxide films on both sides of the silicon pin has different widths or dielectric constants.

3. The memory device of claim 1, wherein the tunneling oxide film has asymmetrical thickness or dielectric constants.

4. A method of operating a memory device, comprising:
    in a multi-bit non-volatile memory device having a dual gate structure, wherein in a read operation of electrons trapped at the electron trap film, values of threshold voltages between a normal direction read ($V_D$>$V_S$) condition and a reverse direction read ($V_D$>$V_S$) condition are different depending on a location where the electrons are trapped, wherein in the case where a read operation is performed on a program in which electrons are trapped at the electron trap film of drain-side silicon pin corners, the reverse direction read ($V_D$>$V_S$) condition having an opposite direction to that of an operating voltage ($V_D$>$V_S$) of the program is employed, and in the case where a read operation is performed on a program in which electrons are trapped closer toward the center of the channel and away from the source-side silicon pin corners, the normal direction read ($V_D$>$V_S$) condition having an opposite direction to that of an operating voltage ($V_D$>$V_S$) of the program is employed.

5. The method as claimed in claim 4, wherein in a read operation, a 2-bit operation can be implemented using both normal and reverse direction read conditions.

6. The method as claimed in claim 4, wherein in a read operation, a 2-bit operation can be implemented employing any one of normal and reverse direction read conditions by using different threshold voltages.

7. The method as claimed in claim 6, wherein in a read operation, a 3-bit operation can be implemented using both the normal and reverse direction read conditions.

8. The method as claimed in claim 4, wherein in a read operation, a 4-bit operation can be implemented using both normal and reverse direction read conditions.

9. The method as claimed in claim 4, wherein in a read operation, a 4-bit operation can be implemented employing any one of normal and reverse direction read conditions by using different threshold voltages.

10. The method as claimed in claim 9, wherein in a read operation, a 5-bit operation can be implemented using both the normal and reverse direction read conditions.

* * * * *